US010632499B2

(12) United States Patent
Buckland

(10) Patent No.: US 10,632,499 B2
(45) Date of Patent: Apr. 28, 2020

(54) THICKNESS MODE TRANSDUCERS AND RELATED DEVICES AND METHODS

(71) Applicant: Sensus USA, Inc., Morrisville, NC (US)

(72) Inventor: Justin Rorke Buckland, Cambridge (GB)

(73) Assignee: Sensus USA, Inc., Morrisville, NC (US)

(*) Notice: Subject to any disclaimer, the term of this patent is extended or adjusted under 35 U.S.C. 154(b) by 617 days.

(21) Appl. No.: 15/374,044

(22) Filed: Dec. 9, 2016

(65) Prior Publication Data

US 2018/0161817 A1 Jun. 14, 2018

(51) Int. Cl.
*B06B 1/06* (2006.01)
*H01L 41/04* (2006.01)
*G01F 1/66* (2006.01)
*H01L 41/277* (2013.01)

(52) U.S. Cl.
CPC .......... *B06B 1/0648* (2013.01); *B06B 1/0677* (2013.01); *G01F 1/662* (2013.01); *H01L 41/277* (2013.01)

(58) Field of Classification Search
CPC ........ B06B 1/06; B06B 1/0618; B06B 1/0644
See application file for complete search history.

(56) References Cited

U.S. PATENT DOCUMENTS

| 4,297,607 | A | 10/1981 | Lynnworth et al. |
| 4,523,122 | A | 6/1985 | Tone et al. |
| 5,726,952 | A * | 3/1998 | Eckert ................... B06B 1/0618 310/322 |
| 6,558,332 | B1 | 5/2003 | Shimizu |
| 6,989,625 | B2 | 1/2006 | Suzuki et al. |
| 2007/0049829 | A1 | 3/2007 | Kaminski et al. |
| 2007/0080609 | A1* | 4/2007 | Johnson ................ B06B 1/0618 310/323.04 |

FOREIGN PATENT DOCUMENTS

| CN | 201 277 871 Y | 7/2009 |
| GB | 1 551 004 | 8/1979 |

OTHER PUBLICATIONS

Gomez Alvarez-Arenas et al., "Novel Impedance Matching Materials and Strategies for Air-Coupled Piezoelectric Transducers," IEEE Sensors, 2013, 4 pages.
(Continued)

*Primary Examiner* — J. San Martin
(74) *Attorney, Agent, or Firm* — Stanek Lemon Crouse & Meeks, PA

(57) ABSTRACT

Transducers are provided including a piezoelectric block having first and second opposing surfaces; a first non-piezoelectric layer on the first surface of the piezoelectric block, the first layer including a low density material having a first thickness; and a second non-piezoelectric layer on the second surface of the piezoelectric block, the second layer including a high density material having a second thickness, the second thickness being different from the first thickness and being at least two times the first thickness. Related devices and methods are also provided.

17 Claims, 5 Drawing Sheets

(56) References Cited

OTHER PUBLICATIONS

Gomez Alvarez-Arenas, Tomas E., "A Nondestructive Integrity Test for Membrane Filters Based on Air-Coupled Ultrasonic Spectroscopy," IEEE Transactions on Ultrasonics, Ferroelectrics, and Frequency Control, vol. 50, No. 6, Jun. 2003, pp. 676-685.

Gomez Alvarez-Arenas, Tomas E., "Acoustic Impedance Matching of Piezoelectric Transducers to the Air," IEEE Transactions on Ultrasonics, Ferroelectrics, and Frequency Control, vol. 51, No. 5, May 2004, pp. 624-633.

Percin et al. "Piezoelectrically actuated flextensional micromachined ultrasound transducers," Ultrasonics, vol. 40, 2002, pp. 441-448.

Piezoelectric Tonpilz Transducer, Consol Application Gallery, Prior Art, Printed from the Internet at https://www.comsol.com/model/piezoelectric-tonpilz-tranducers-11478; 52 pages.

Notification Concerning Transmittal of International Preliminary Report on Patentability, PCT/US2017/065010, dated Jun. 20, 2019, 8 pages.

Notification of Transmittal of the International Search Report and the Written Opinion of the International Searching Authority, or the Declaration, PCT/US2017/065010, dated Mar. 14, 2018, 15 pages.

* cited by examiner

THICKNESS MODE TRANSDUCERS AND RELATED DEVICES AND METHODS

CROSS REFERENCE TO RELATED APPLICATIONS

This application is related to U.S. application Ser. No. 15/374,129, filed Dec. 10, 2016, entitled Thickness-Planar Mode Transducers and Related Devices, the disclosure of which is hereby incorporated herein by reference as if set forth in its entirety.

FIELD

The present inventive concept relates generally to transducers and, more particularly, to ultrasonic transducers and related methods and devices.

BACKGROUND

Ultrasonic transducers preferably include small but precisely dimensioned piezoelectric elements in order to provide a high degree of part-to-part repeatability with low material costs. Conventional devices generally include a cylindrical piezoelectric element having a thickness that defines a resonant frequency of the piezoelectric element. In these devices, the element thickness may be, for example, about 7.0 mm when operated at 170 kHz and about 3.0 mm when operated at 400 kHz. However, fabricating precisely dimensioned piezoelectric cylinders of this size and shape can be very expensive as the cylinder faces have to be machined after firing.

Furthermore, conventional devices generally provide an electrical connection to the piezoelectric element using a soldered wire. However, solder can be unreliable and may cause increased part-to-part variability as the mass and placement of solder is not tightly controlled and can have a significant effect on the transducer vibrational behavior. As the size of the piezoelectric element decreases, these problems generally become more severe.

SUMMARY

Some embodiments of the present inventive concept provide transducers including a piezoelectric block having first and second opposing surfaces; a first non-piezoelectric layer on the first surface of the piezoelectric block, the first layer including a low density material having a first thickness; and a second non-piezoelectric layer on the second surface of the piezoelectric block, the second layer including a high density material having a second thickness, the second thickness being different from the first thickness and being at least two times the first thickness.

In further embodiments, the low density material may be aluminium and the high density material may be one of steel and brass. The first layer may be a front layer of the transducer and may have a thickness of from about 1.00 mm to about 2.00 mm. The second layer may be a back layer of the transducer and may have a thickness of from about 2.0 mm to about 5.0 mm.

In still further embodiments of the present inventive concept, the piezoelectric block may be a soft PZT material selected from one of grade P5A material and P5H material and may have a thickness of from about 1.00 mm to about 3.00 mm.

In some embodiments, a resonant frequency of the transducer may be about 167 kHz and dimensions of the front layer may be 7×7×1.5 mm; dimensions of the back layer may be 7×7×4 and dimensions of the piezoelectric block may be 5×5×3.

In further embodiments, a resonant frequency of the transducer may be about 167 kHz and dimensions of the front layer may be 7×7×2 mm; dimensions of the back layer may be 7×7×5 mm and dimensions of the piezoelectric block may be 5×5×2.39 mm.

In still further embodiments, a resonant frequency of the transducer may be about 400 kHz and dimensions of the front layer may be 5×5×1 mm; dimensions of the back layer may be 5×5×2 mm and dimensions of the piezoelectric block may be 4×4×1 mm.

In some embodiments, the first and second layer may be coupled to the first and second surfaces of the piezoelectric block, respectively, using an adhesive. The electrical contact between the piezoelectric block and the first and second layers may be obtained using the adhesive and without a wire soldered between the piezoelectric block and the first and second layers.

In further embodiments, the transducer may be an ultrasonic transducer configured for one of a gas meter, a water meter and a heat meter.

In still further embodiments, the transducer may further include an acoustic matching layer on a surface of the front layer opposite the piezoelectric block.

Some embodiments of the present inventive concept provide an electronic device including at least one transducer. The at least one transducer includes a piezoelectric block having first and second opposing surfaces; a first non-piezoelectric layer on the first surface of the piezoelectric block, the first layer including a low density material having a first thickness; and a second non-piezoelectric layer on the second surface of the piezoelectric block, the second layer including a high density material having a second thickness, the second thickness being different from the first thickness and being at least two times the first thickness.

Further embodiments of the present inventive concept provide methods of fabricating a transducer including providing a piezoelectric block having first and second surfaces, the first surface being spaced apart from and opposite the second surface; bonding a non-piezoelectric front layer including a low density material to a first surface of the piezoelectric block using an adhesive; bonding a non-piezoelectric second layer including a high density material to a second surface of the piezoelectric block using the adhesive to provide a bonded structure; and curing the bonded structure.

In still further embodiments, bonding the first layer may be preceded by providing the first layer including the low density material and having a first thickness. Bonding the second layer may be preceded by providing the second layer including the high density material and having a second thickness, the second thickness being different from the first thickness and being at least two times the first thickness.

In some embodiments, providing the first layer may include providing a first layer comprising aluminium and providing the second layer may include providing a second layer comprising one of steel and brass.

In further embodiments, the first layer may be a front layer of the transducer and may have a thickness of from about 1.00 mm to about 2.00 mm. The second layer may be a back layer of the transducer and may have a thickness of from about 2.0 mm to about 5.0 mm. The piezoelectric block may have a thickness of from about 1.00 mm to about 3.00 mm.

In still further embodiments, electrical contact between the piezoelectric block and the first and second layers may be provided using the adhesive and without a wire soldered between the piezoelectric block and the first and second layers.

In some embodiments, the method further includes curing the bonded structure comprises curing the bonded structure under heat and pressure in a chamber.

DETAILED DESCRIPTION

Figure 1:
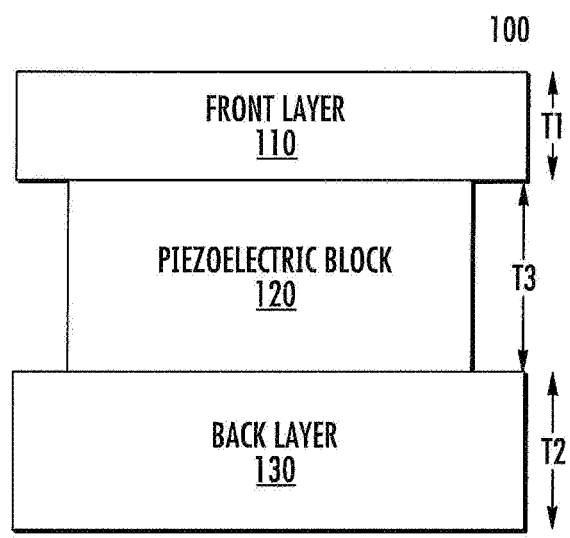
FIG. 1 is a diagram illustrating a transducer in accordance with some embodiments of the present inventive concept.

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As discussed in the background of the inventive concept, conventional cylindrical piezoelectric elements may be expensive to manufacture and soldering the electrical connections may provide poor transducer performance. A dicing saw may be used to address the difficult and costly manufacturing of a cylindrical piezoelectric element. The dicing saw may be used to create a cuboid piezoelectric element instead of a cylindrical piezoelectric element, which can be a cost-effective way to create a precisely dimensioned part. However, this generally requires a thickness of less than approximately 2.5 mm. As a result, there is a need for a transducer design where the piezoelectric element dimensions are small enough to be manufactured cost-effectively by dicing a piezoelectric tile with a wafer dicing saw.

Accordingly, some embodiments of the present inventive concept provide a thickness mode ultrasonic transducer manufactured using a reduced volume of piezoelectric material to reduce manufacturing costs. The piezoelectric element may be circular, or preferably cuboid in shape to allow precise fabrication using a wafer dicing saw. Additional non-piezoelectric layers or parts may be used to reduce the thickness of piezoelectric material given a target operating frequency and to increase the acoustically transmitting area as will be discussed further below with respect to FIGS. 1 through 8.

Referring first to FIG. 1, a transducer 100 in accordance with some embodiments of the present inventive concept will be discussed. As illustrated therein, the transducer 100 includes a non-piezoelectric front layer 110, a piezoelectric block 120 and a non-piezoelectric back layer 130. In some embodiments of the present inventive concept, the front layer 110 may include a low density material, for example, aluminium and the back layer 130 may include a high density material, for example, stainless steel and brass. As used herein, the term "low density material" refers to a material having a density less than 4 g/cm³. Similarly, the term "high density metal" refers to a metal having a density greater than 6 g/cm³. Although embodiments of the present inventive concept are discussed having metal front and back layers, embodiments of the present inventive concept are not limited to this configuration. Any non-piezoelectric material suited for embodiments discussed herein may be used for the front and back layers without departing from the scope of the present inventive concept.

The transducer 100 may emit ultrasound through the front face (low density material). The piezoelectric materials may be, for example, PZT, grades P5A and P5H or substantial equivalents thereof. However, it will be understood that embodiments of the present inventive concept are not limited to this configuration. In particular, embodiments of the present inventive concept are not limited to lead zirconate titanate (PZT) formulations and may extend to other piezoelectric ceramics without departing from the scope of the present inventive concept.

As will be understood, the dimensions of the front layer 110, piezoelectric block 120 and the back layer 130 of the transducer 100 may vary based on the desired functionality thereof, for example, a thickness of the piezoelectric element may correspond to a resonant frequency thereof. As illustrated in FIG. 1, the front layer 110 has a thickness T1, the back layer 130 has a thickness T2 and the piezoelectric block 120 has a thickness T3. In some embodiments, the thickness T2 of the back layer 130 may be at least two times the thickness T1 of the front layer. The front and back layers 110 and 130, respectively, add mass and thickness to the device, which in turn allow a thickness of the piezoelectric layer to be reduced, i.e. the volume of the piezoelectric layer can be reduced.

Table 1 set out below includes some example dimensions based on desired functionality (design). The values illustrated below in Table 1 are provided for example only and embodiments of the present inventive concept are not limited to this configuration.

TABLE 1

| Design | Back Layer | Piezoelectric Block | Front Layer |
| --- | --- | --- | --- |
| 167 kHz - A | 7 × 7 × 4 mm (steel) | 5 × 5 × 3 mm | 7 × 7 × 1.5 mm (aluminium) |
| 167 kHz - B | 7 × 7 × 5 mm (steel) | 5 × 5 × 2.39 mm | 7 × 7 × 2 mm (aluminium) |
| 400 kHz | 5 × 5 × 2 mm (steel) | 4 × 4 × 1 mm | 5 × 5 × 1 mm (aluminium) |

Figure 2:
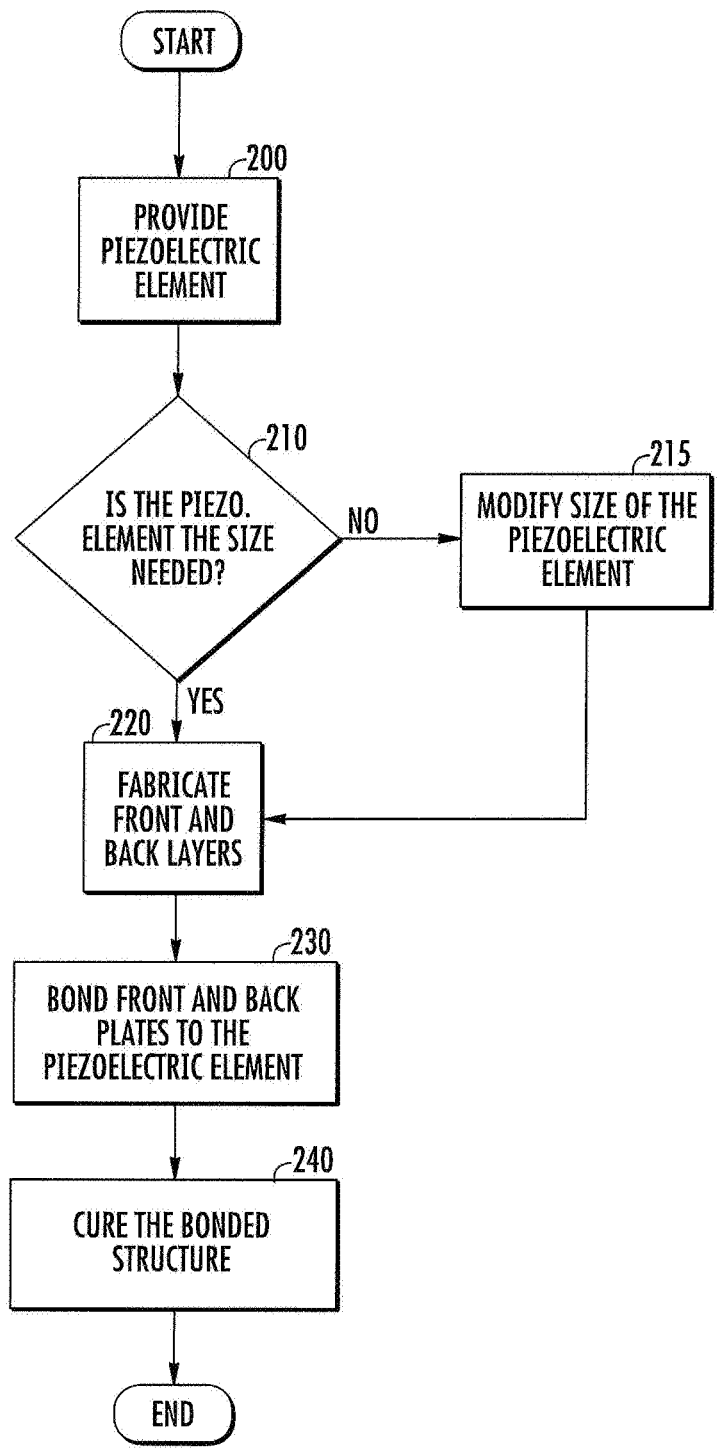
FIG. 2 is a flowchart illustrating processing steps in the fabrication of transducers in accordance with some embodiments of the present inventive concept.

Referring now to FIG. 2, a flowchart illustrating processing steps in the fabrication of example transducers in accordance with various embodiments of the present inventive concept will be discussed. Operations begin at block 200 by providing a piezoelectric element. It will be understood that the piezoelectric element may be manufactured or obtained from third party. In some embodiments, the piezoelectric materials may be soft PZT, grades P5A and P5H or substantial equivalents thereof, but as discussed above, the piezoelectric materials are not limited to PZT. The 5×5 mm blocks, both the 3.0 mm and 2.39 mm thicknesses, were obtained from Morgan Electroceramics (UK) for low frequency transducers, for example, 167 kHz; and larger piezoelectric plates (1.0 mm thickness) were obtained from PI Ceramic (Germany). If the piezoelectric elements are obtained from a third party, it may be determined if the piezoelectric element is the requisite size (block 210). If it is determined that the piezoelectric element is not the requisite size (block 210), the piezoelectric element may be modified to the proper size (block 215). For example, the 1.0 mm thickness plates may be diced in-house into 4×4 mm bocks for high frequency transducers, for example, 400 kHz. If it is determined that the piezoelectric element is the requisite size (block 210), operations proceed to block 220 by fabricating the front and back layers of the transducer. In some embodiments, the back and front layers of steel and aluminium, respectively, may be machined from a solid.

Once all three elements, the piezoelectric element and back and front layers, are complete, the back and front layers are bonded to the piezoelectric element (block 230). In some embodiments, to provide an electrical connection, rather than a soldered wire, the piezoelectric element and the back and front layers are bonded using an adhesive, for example, a two-part epoxy resin. For example, an epoxy resin Epotek 353 NDT provided by Epoxy Technology, Inc may be used. The bonded structure may then be cured (block 240) under heat and pressure in a chamber, for example, a mechanical alignment jig. The quantity of applied adhesive and process conditions provide electrical contact between the piezoelectric electrodes and the metal front and back blocks, allowing electrical connection to be made to the metal parts and avoiding the need for a solder contact with the piezoelectric element. It will be understood that the manufacturing process is not limited to the process used herein and, in fact, more cost-effective manufacturing routes would likely be used for mass production without departing from the scope of the present inventive concept.

Figure 3A:
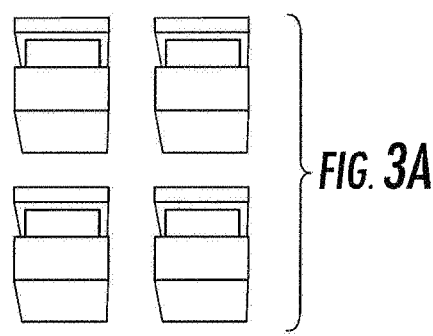
FIG. 3A is a figure illustrating low frequency transducers manufactured in accordance with some embodiments of the present inventive concept.
Figure 3B:
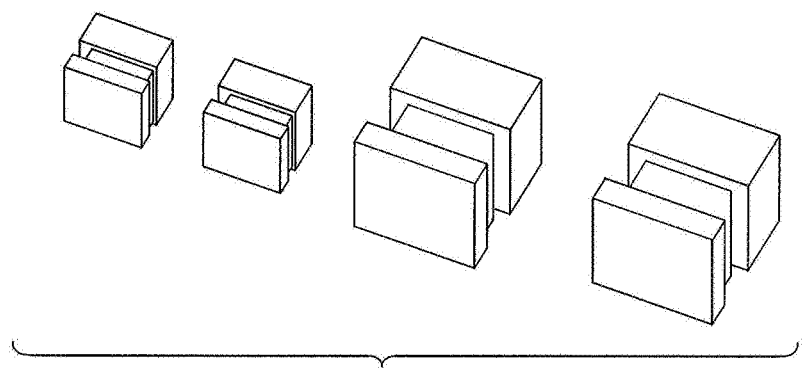
FIG. 3B is a figure illustrating high frequency transducers and low frequency transducers manufactured in accordance with some embodiments of the present inventive concept.

FIGS. 3A and 3B are figures illustrating transducers manufactured in accordance with some embodiments of the present inventive concept. FIG. 3A illustrates low frequency transducers and FIG. 3B illustrates high and low frequency transducers. As is clear from FIG. 3B, the high frequency transducers are smaller than the low frequency transducers.

Figure 4A:
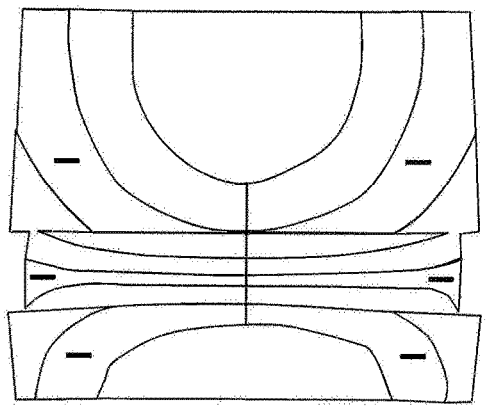
FIGS. 4A and 4B are diagrams illustrating finite element analysis of the oscillation mode of thickness mode transducers in accordance with some embodiments of the present inventive concept.
Figure 4B:
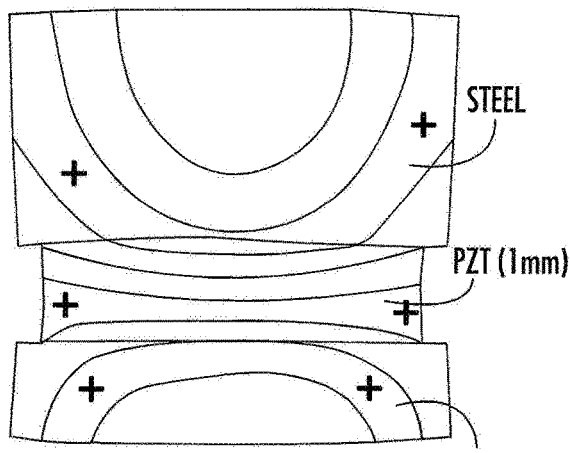

Referring now to FIGS. 4A and 4B, diagrams illustrating axial displacement of a 400 kHz thickness mode transducer in accordance with some embodiments of the present inventive concept will be discussed. The various shaded layers in FIGS. 4A and 4B represent the back layer (steel), the front layer (aluminium) and the piezoelectric element (1 mm) in between. The simulation was performed on a 400 kHz thickness mode transducers using an axisymmetric approximation of the geometry. The various shades indicate axial displacement at two points in the oscillation with 180° phase difference. The aluminum front layer oscillates with larger velocity than the steel back layer. In particular, in FIG. 4A, the aluminum front layer and steel back layer are compressed (−) towards the center where the piezoelectric material (labeled) is also compressed (−). Similarly, when 180 degrees out of phase, the piezoelectric material (labeled) expands (+) upwards, as do the aluminum and steel layers.

Figure 5:
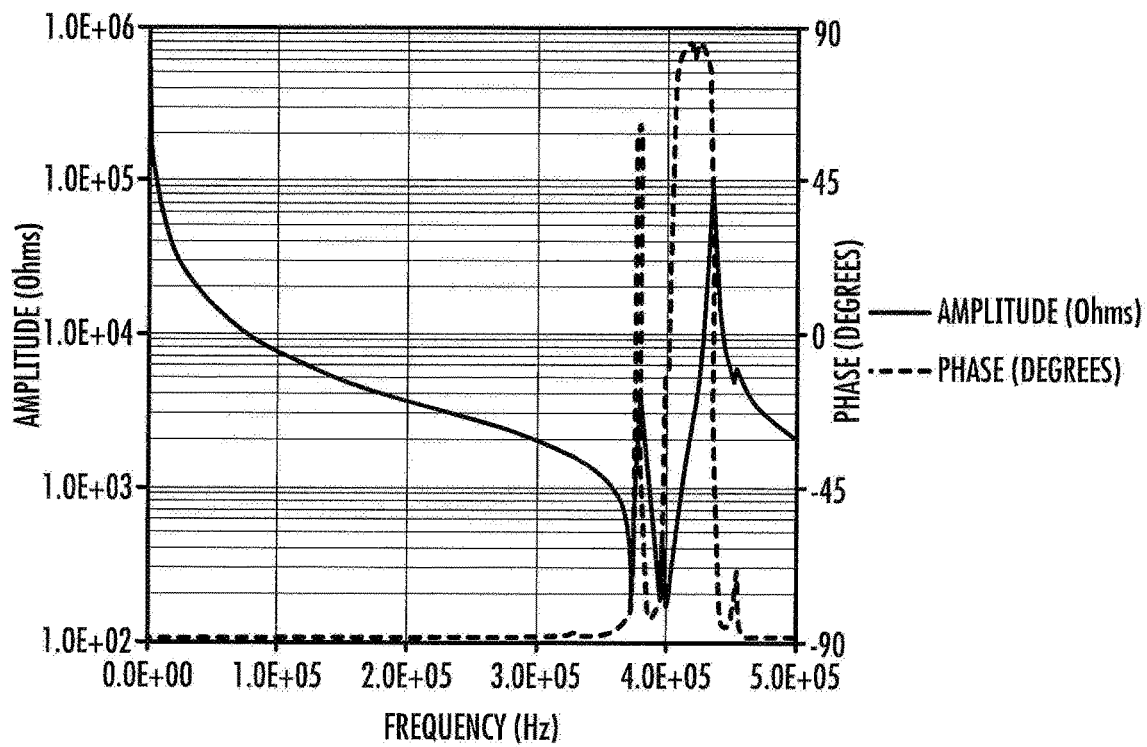
FIG. 5 is a graph illustrating the electrical impedance spectrum of a high frequency transducer in accordance with some embodiments of the present inventive concept.
Figure 6:
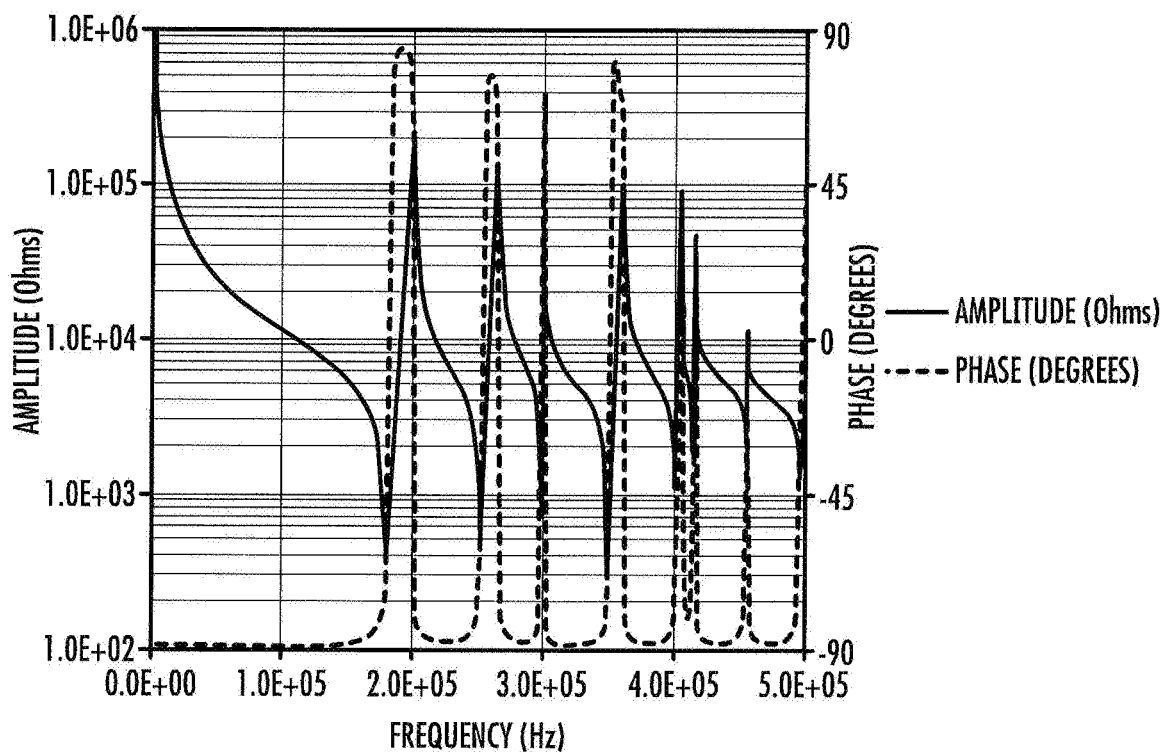
FIG. 6 is a graph illustrating the electrical impedance spectrum of a low frequency transducer in accordance with some embodiments of the present inventive concept.

Transducers in accordance with various embodiments of the present inventive concept were tested to illustrate the improved performance thereof. In particular, transducers were mounted using two pairs of spring probes (RS Stock No. 261-5092) contacting on the sides of the aluminum front layer and stainless steel back layer, to provide mechanical and electrical contact. The electrical impedance was measured across the frequency range 1.0 to 500 kHz using an electrical impedance analyser (4294A Precision Impedance Analyser, Agilent). Results of the impedance spectra test are illustrated in FIGS. 5 and 6. In particular, FIG. 5 illustrates results in a high frequency transducer and FIG. 6 illustrates results in a low frequency transducer. Transducer resonances can be identified by minima in the impedance modulus |Z|. In embodiments providing a high frequency transducer, FIG.

5 illustrates an impedance minimum at 399 kHz which corresponds to the intended mode of operation. In embodiments providing a low frequency transducer, FIG. 6 illustrates an impedance minimum at 181 kHz which corresponds to the intended mode of operation.

Figure 7:
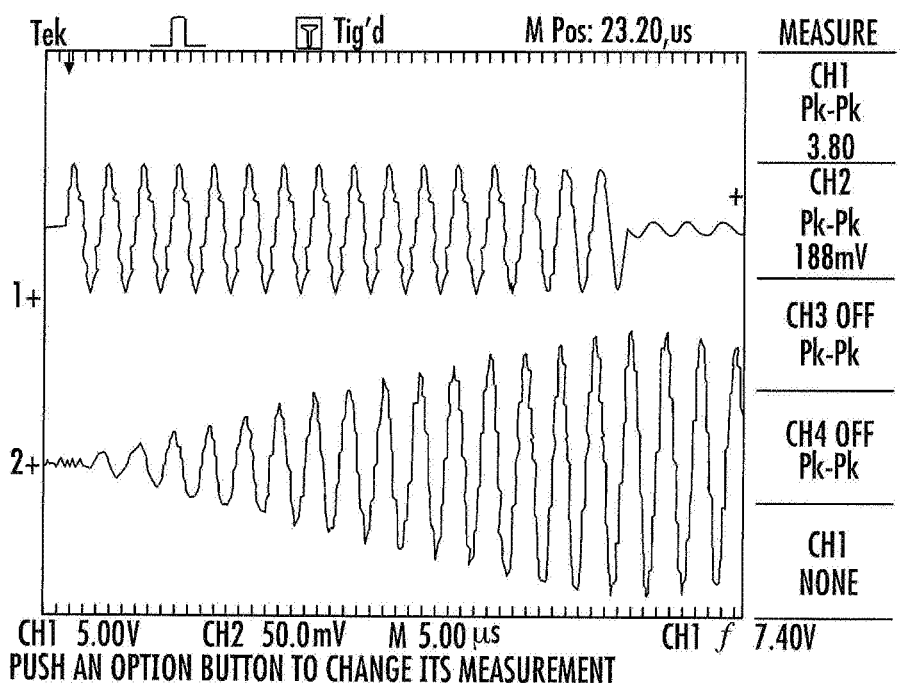
FIG. 7 is a graph illustrating laser vibrometer test results in accordance with some embodiments of the present inventive concept.

In further tests, the transducer velocity response to a 10 Vpp, 16 cycle sine wave burst was measured using a single point laser vibrometer (OFV-505 vibrometer head with OFV-5000 controller, Polytec GmbH). Laser vibrometer test results are illustrated in FIG. 7. In FIG. 7, the upper trace illustrates the drive signal and the lower trace illustrates the vibrometer output (1000 mm/s/V). The transducer vibration amplitude increases during the drive burst, reaching a peak-peak velocity of 188 mm/s at the end of the drive burst. The acoustic output pressure is proportional to the front face velocity.

Transducers in accordance with some embodiments of the present inventive concept may include an acoustic matching layer. Acoustic Matching layers are used to improve acoustic transmission efficiency between a high acoustic impedance acoustic element (PZT, impedance $Z_1$) and a low acoustic impedance medium (gas, impedance $Z_3$). The acoustic impedance of a material is defined as the product of density and speed of sound.

In the case of a single matching layer, the ideal matching layer acoustic impedance, $Z_2$, is the geometric mean of the transducer and gas acoustic impedances:

$$Z_2 = \sqrt{Z_1 Z_3} \qquad \text{Eqn. (1)}$$

TABLE 2

| Material | Acoustic Impedance (kg/m² · s) |
|---|---|
| PZT 5A | $34 \times 10^6$ |
| methane (1 atm, 20 C.) | 300 |
| matching layer (ideal) | $1 \times 10^5$ |

This typically requires a matching layer composed of a solid material with very low speed of sound and low density. However, in general suitable materials do not occur naturally and have to be constructed with special manufacturing processes. For example, suspensions of hollow glass microspheres in epoxy resin are used in the current Sensus transducer, matching layers using glass and resin microspheres are discussed, for example, in U.S. Pat. No. 4,523,122 and a matching layer using a dry gel material is discussed in, for example, U.S. Pat. No. 6,989,625, the disclosures of which are incorporated herein by reference as if set forth in their entirety.

In some embodiments, the acoustic matching layer may include, for example, Polyethersulfone, Polypropylene, PTFE, PVDF, Nylon, Polyamide, PMMA, Vinylic/acrylic copolymer, Cellulose ester, Cellulose acetate, Nitrocellulose, and the like. Embodiments of the present inventive concept may use any acoustic matching layers without departing from the scope of the present inventive concept.

As discussed briefly above with respect to FIGS. 1 through 7, some embodiments of the present inventive concept provide an ultrasonic transducer using a small but precisely dimensioned piezoelectric element, in order to provide a high degree of part-to-part repeatability with low material costs. The piezoelectric element is made small by providing non-piezoelectric front and back layers to increase the total thickness of the structure.

Figure 8:
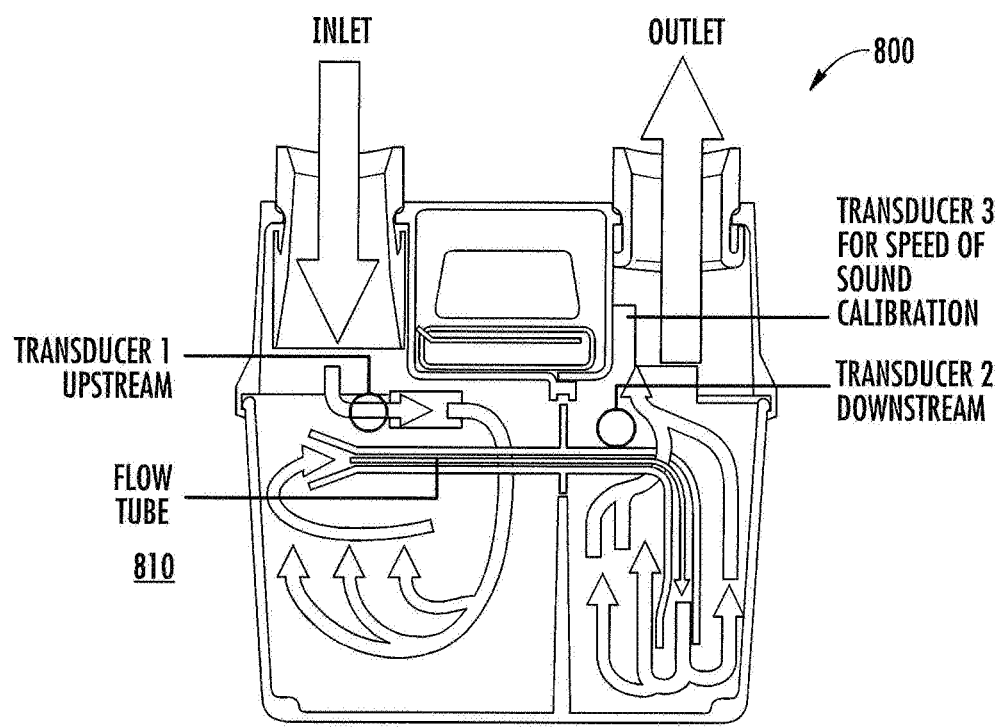
FIG. 8 is a block diagram illustrating an example gas meter including transducers in accordance with embodiments of the present inventive concept.

Transducers in accordance with embodiments discussed herein may be used in any device which lends itself to such a transducer. For example, these transducers may be used in water meters, gas meters, heat meters and the like. By way of example, transducers may be used in gas meters as illustrated in FIG. 8. As illustrated therein, the gas meter 800 includes three transducers. Transducer 1 (upstream) and transducer 2 (downstream) may be used to measure time-of-flight of an ultrasonic signal along the flow tube 810 in forward and reverse directions. The gas meter 800 may also be configured to compensate for gas properties and conditions using a separate sound measurement using transducer 3.

It will be understood that FIG. 8 is provided for example only and embodiments of the present inventive concept are not limited to this configuration. Transducers as discussed herein may be used in many different devices without departing from the scope of the present inventive concept.

Example embodiments are described above with reference to block diagrams and/or flowchart illustrations of systems and devices. The functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specification, there have been disclosed exemplary embodiments of the inventive concept. However, many variations and modifications can be made to these embodiments without substantially departing from the principles of the present inventive concept. Accordingly, although specific terms are used, they are used in a generic and descriptive sense only and not for purposes of limitation, the scope of the inventive concept being defined by the following claims.

That which is claimed is:

1. A transducer comprising:
   a single piezoelectric block having first and second opposing surfaces;
   a first non-piezoelectric layer directly on the first surface of the piezoelectric block, the first non-piezoelectric layer including a low density material having a first thickness; and
   a second non-piezoelectric layer directly on the second surface of the piezoelectric block, the second non-piezoelectric layer including a high density material having a second thickness, the second thickness being at least two times the first thickness.

2. The transducer of claim 1:
   wherein the low density material comprises aluminium; and
   wherein the high density material comprises one of steel and brass.

3. The transducer of claim 2:
   wherein the first layer is a front layer of the transducer and has a thickness of from about 1.00 mm to about 2.00 mm; and
   wherein the second layer is a back layer of the transducer and has a thickness of from about 2.0 mm to about 5.0 mm.

4. The transducer of claim 1, wherein the piezoelectric block comprises a soft PZT material selected from one of grade P5A material and P5H material and wherein the piezoelectric block has a thickness of from about 1.00 mm to about 3.00 mm.

5. The transducer of claim 1, wherein a resonant frequency of the transducer is about 167 kHz and dimensions of the first layer are 7×7×1.5 mm; dimensions of the second layer are 7×7×4 and dimensions of the piezoelectric block are 5×5×3.

6. The transducer of claim 1, wherein a resonant frequency of the transducer is about 167 kHz and dimensions of the first layer are 7×7×2 mm; dimensions of the second layer are 7×7×5 mm and dimensions of the piezoelectric block are 5×5×2.39 mm.

7. The transducer of claim 1, wherein a resonant frequency of the transducer is about 400 kHz and dimensions of the first layer are 5×5×1 mm; dimensions of the second layer are 5×5×2 mm and dimensions of the piezoelectric block are 4×4×1 mm.

8. The transducer of claim 1, wherein the first and second layers are coupled to the first and second surfaces of the piezoelectric block, respectively, using an adhesive.

9. The transducer of claim 8, wherein electrical contact between the piezoelectric block and the first and second layers is obtained using the adhesive and without a wire soldered between the piezoelectric block and the first and second layers.

10. The transducer of claim 1, wherein the transducer is an ultrasonic transducer configured for one of a gas meter, a water meter and a heat meter.

11. An electronic device, comprising:
 at least one transducer, the at least one transducer comprising:
 a single piezoelectric block having first and second opposing surfaces;
 a first non-piezoelectric layer directly on the first surface of the piezoelectric block, the first non-piezoelectric layer including a low density material having a first thickness; and
 a second non-piezoelectric layer directly on the second surface of the piezoelectric block, the second non-piezoelectric layer including a high density material having a second thickness, the second thickness being at least two times the first thickness.

12. The device of claim 11:
 wherein the low density material comprises aluminium; and
 wherein the high density material comprises one of steel and brass.

13. The device of claim 12:
 wherein the first layer is a front layer of the transducer and has a thickness of from about 1.00 mm to about 2.00 mm; and
 wherein the second layer is a back layer of the transducer and has a thickness of from about 2.0 mm to about 5.0 mm.

14. The device of claim 11, wherein the piezoelectric block comprises a soft PZT material selected from one of grade P5A material and P5H material.

15. The device of claim 14, wherein the piezoelectric block has a thickness of from about 1.00 mm to about 3.00 mm.

16. The device of claim 11, wherein the first and second layers are coupled to the first and second surfaces of the piezoelectric block, respectively, using an adhesive.

17. The device of claim 16, wherein electrical contact between the piezoelectric block and the first and second layers is obtained using the adhesive and without a wire soldered between the piezoelectric block and the first and second layers.

* * * * *